United States Patent [19]

Hunt

[11] 4,281,314
[45] Jul. 28, 1981

[54] SELECTION SWITCHING APPARATUS
[75] Inventor: Theodore R. Hunt, Aloha, Oreg.
[73] Assignee: Morris S. Wagner, Beaverton, Oreg.; a part interest
[21] Appl. No.: 912,942
[22] Filed: Jun. 5, 1978
[51] Int. Cl.³ ............................................. H04Q 9/00
[52] U.S. Cl. ............................ 340/147 R; 179/1 SW; 179/1 B
[58] Field of Search ...................... 340/147 R, 147 C; 179/1 B, 1 C, 1 SW

[56]  References Cited
U.S. PATENT DOCUMENTS

| 3,626,097 | 12/1971 | Bloom et al. | 179/1 B |
| 3,688,262 | 8/1972 | Liguori | 340/147 R |
| 3,922,641 | 11/1975 | Gates, Jr. | 340/147 C |
| 4,024,345 | 5/1977 | Kochem | 179/1 B |
| 4,057,711 | 11/1977 | Asthana et al. | 340/147 R |
| 4,176,251 | 11/1979 | Odlen et al. | 179/1 SW |

Primary Examiner—Donald J. Yusko
Attorney, Agent, or Firm—Kolisch, Hartwell & Dickinson

[57] ABSTRACT

Apparatus for selectively interconnecting different pieces of audio electrical equipment, such as an amplifier and a tuner, for the purpose of demonstrating the same to a potential purchaser. Units to be demonstrated are connected to different address-assigned ports in the apparatus, and a keyboard is operated to address the particular ports for the units desired to be connected. The apparatus includes an electronic memory which stores the addresses of the addressed ports, and which then effects a connection between such ports.

2 Claims, 5 Drawing Figures

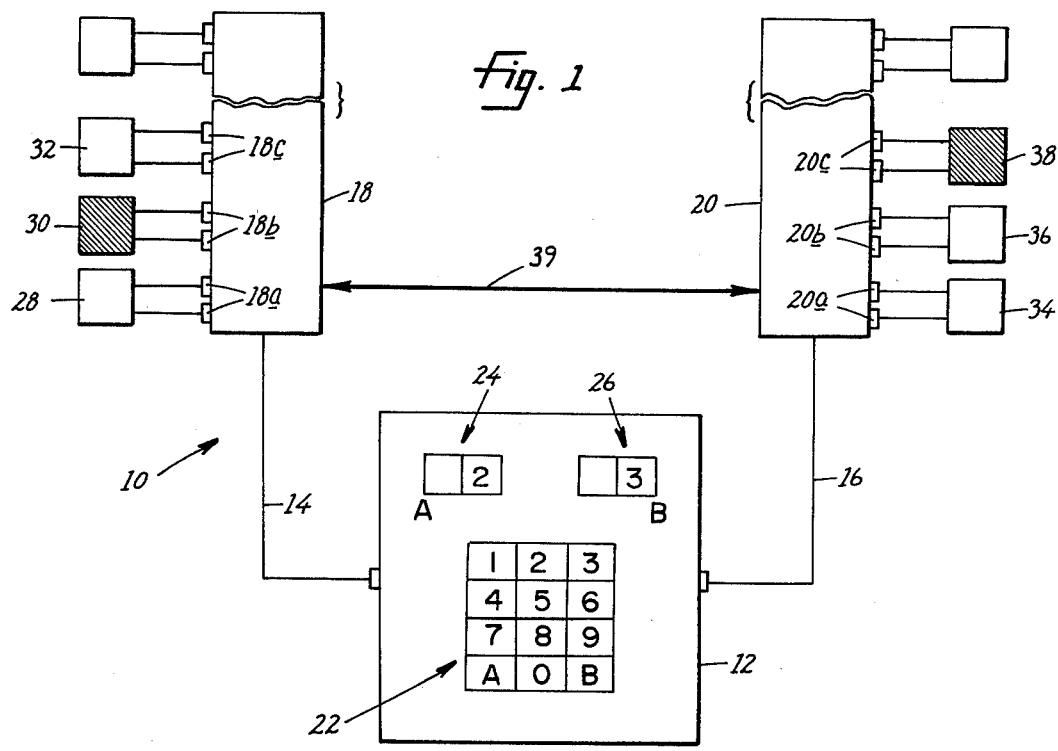
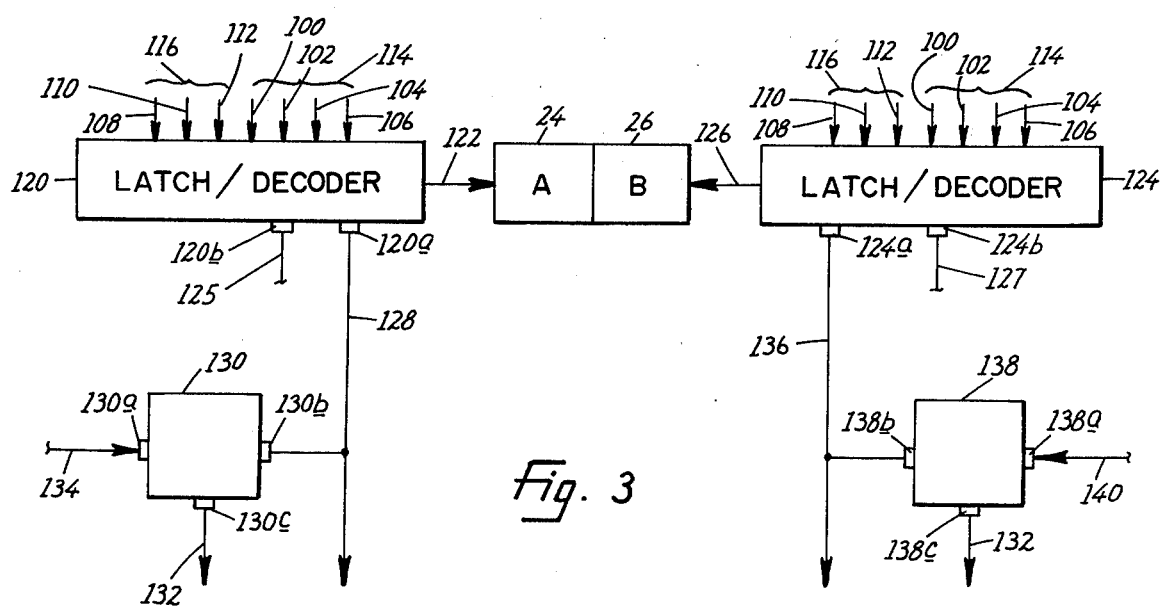

SELECTION SWITCHING APPARATUS

BACKGROUND AND SUMMARY OF THE INVENTION

This invention pertains to apparatus which assists in the display and demonstration of audio electrical equipment, such as amplifiers, tuners, tape decks, speakers, etc. More specifically, it pertains to apparatus which facilitates quick and easy selection and interconnection of different arrangements of such units.

Those familiar with the display of audio equipment of the type generally mentioned above, are aware that probably the most commonly used system for interconnecting different units during a demonstration includes a hard-wired, mechanical switching system in which a large variety and number of push buttons or toggle switches are manipulated to set up each different demonstration. Often this kind of arrangement becomes very confusing even to sales people supposedly familiar with it. Extreme complications frequently arise when a particular piece of equipment is moved from one location to another, removed entirely from a display area, or when a new piece of equipment is added.

A general object of the present invention is to provide unique apparatus for selectively interconnecting different pieces of audio equipment, which apparatus takes care of the problems, confusions, and complications encountered with prior art systems.

More particularly, an object of the invention is to provide such apparatus which enables the quick and easy interconnection between different selected audio components, while at the same time substantially completely eliminating confusion as to how to make different selected connections.

According to a preferred embodiment of the invention, audio units which are to be demonstrated are connected to different address-assigned ports that form part of the system. In other words, each port in the apparatus is known to have a certain predictable address. A keyboard in the system is operated to "call up" the address of those particular ports for the units which are desired to be connected. More specifically, whenever the address of a particular port is called up through operation of the keyboard, the system of the invention prepares to make a connection between whatever audio unit is connected to that port, and one or more pieces of similarly selected audio equipment. Included in the system is an electronic memory which stores the addresses of the addressed ports, and which then (following storage) effects a connection between such ports.

For the purpose of illustration herein, and in order to simplify the drawings and the description of the invention, the apparatus of the invention is described in conjunction with enabling connections between just two different units. In particular, a system is described which allows selective interconnections between different amplifiers and different AM/FM tuners. However, and as will be further expressed hereinbelow, the invention is readily adaptable for use in setting up connections between many more than simply two audio units. For example, the system may be used to set up simultaneous interconnections between an amplifier, a set of speakers, a tuner, a tape deck, a signal processor (such as an audio equalizer), etc.

Various other objects and advantages which are attained by the invention will become more fully apparent as the description which now follows is read in conjunction with the accompanying drawings.

DESCRIPTION OF THE DRAWINGS

FIG. 1 is a simplified fragmentary block diagram of a system constructed in accordance with the present invention.

FIG. 3 is a block diagram illustrating another portion of the system of FIG. 1, wherein stored addresses are used to effect a display thereof, and to produce a control signal for setting up a circuit-path between selected audio units.

DETAILED DESCRIPTION OF THE INVENTION

1. Explanation of Terminology

Figure 2:
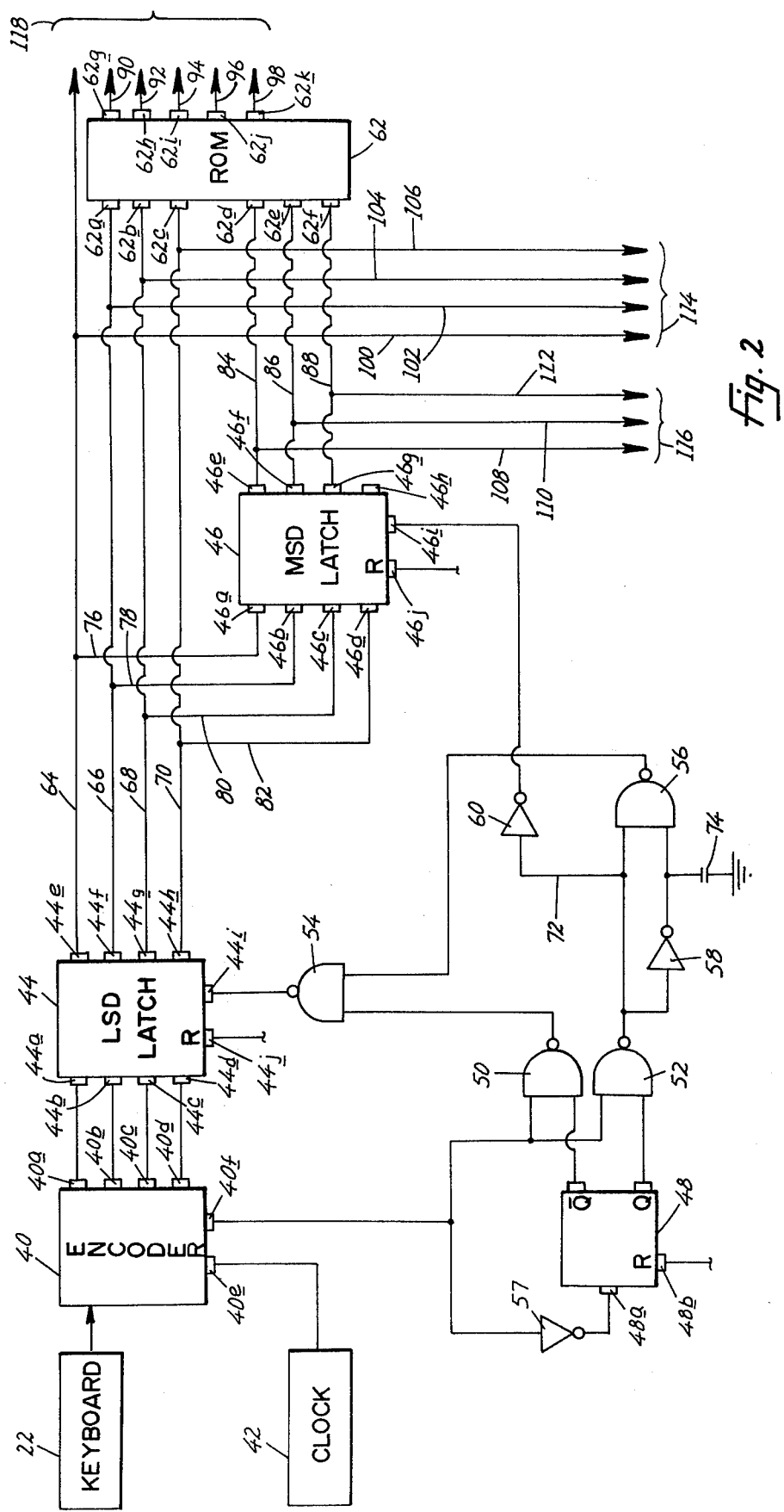
FIG. 2 is a block/schematic diagram illustrating a keyboard-addressing and address memorizing portion of the system of FIG. 1.

Explaining briefly certain terminology which will be used in the description that follows, various components shown in the drawings operate in response to a pair of voltage levels. More specifically, one of these levels corresponds to a certain positive voltage (typically about +5 volts) which will be referred to hereinafter as a 1 state the other level corresponds essentially to ground, and will be called hereinafter a 0 state. A terminal or conductor having one of these voltage levels on it will be referred to as being in, or as having on it, either a 1 or a 0 state.

2. Description of Logic Units Used

Among the components illustrated in the drawings which respond to the two voltage levels just mentioned are certain logic gates. More specifically, two different types of gates, all conventional in construction, are employed. These are referred to as NAND and OR gates.

In a NAND gate: with a 0 state on any input, the output is held in a 1 state; and, with all inputs in 1 states, the output is in a 0 state.

An OR gate functions whereby: if any input is in a 1 state, the output is also held in a 1 state; if all inputs are in 0 states, then the output is placed in a 0 state.

3. The Invention Generally

FIG. 1 in the drawings illustrates generally at 10 a system, or apparatus, constructed in accordance with the present invention. As was mentioned earlier, system 10 is described herein in the setting of enabling the selective interconnection of two different kinds of audio units, namely, amplifiers and tuners. Thus, system 10 might be thought of as a "two-channel" system. As will become apparent, however, the system is not limited simply to two-channel type operation.

System 10 includes a main control unit 12 which is connected through suitable cabled conductors represented by lines 14, 16 to two switching circuits 18, 20, respectively. Circuit 18 is associated with what will be referred to herein as the "A" side, or section, of the system, and circuit 20 with what is called the "B" side, or section, of the system.

Indicated at 22, and forming part of control unit 12, is a conventional alpha-numeric keyboard which includes push buttons for the ten digits 0-9, inclusive, and for the two letters A, B. Displayed above keyboard 22 in FIG. 1 are two two-digit light-emitting diode numeric displays 24, 26 which are associated with the A and B sections, respectively, in the system. Display 24 is illustrated displaying the single digit "2", and display 26 is illustrated displaying the single digit "3".

Switching circuits 18, 20 are also referred to herein as selectively changeable circuit-path establishing means. These circuits are provided each with a plurality of pairs of terminals, such as the pairs shown at 18a, 20a, 18b, 20b, 18c, 20c in FIG. 1. Each such pair of terminals is referred to as an electrical coupling port. The paired terminals associated with circuit 18 are referred to as one set of ports, and those associated with circuit 20 as another set of ports.

Suitably and conventionally connected to ports 18a, 18b, 18c are three stereo amplifiers shown at 28, 30, 32, respectively. Similarly connected to ports 20a, 20b, 20c are three stereo AM/FM tuners 34, 36, 38, respectively. It will be understood by those familiar with stereo equipment that each terminal in a port accommodates the usual two-wire connection to the left-channel or right-channel sides in the connected stereo units.

Indicated generally at 39 by a thick line terminating at its opposite ends with arrowheads are conductors through which, according to the internal conditions of circuits 18, 20, left-channel and right-channel connections may be made between any one of the amplifiers connected to circuit 18 and any one of the tuners connected to circuit 20.

Considering the specific situation which is illustrated in FIG. 1, the figure assumes that a user of the system has elected to connect the amplifier which is in address location A2 in the system with the tuner which is in address location B3. All address locations associated with the A side of system 10 are assigned to ports in circuit 18. Thus, address location A1 relates to port 18a, address location A2 to port 18b, etc. All address locations associated with the B side of the system are similarly assigned to ports in circuit 20. Thus, address location B3 relates to port 20c.

Accordingly, the user of the system in FIG. 1 has elected to connect amplifier 30 with tuner 38. As a visual aid in FIG. 1, shading has been used on these two units to indicate the intended cross-connection. In a manner which will be more fully explained shortly, selection of these addresses is confirmed by presentation thereof in the A-side and B-side displays in control unit 12.

4. The Circuitry of FIG. 2

Referring now to FIG. 2, here is shown a portion of the circuitry which is included within control unit 12. Keyboard 22 is shown at the upper left corner of FIG. 2, with the output of this keyboard connected in the usual way to the input of a conventional, commercially available keyboard encoder 40. Keyboard 22 and encoder 40 together constitute an addressing means herein. Also included in the circuitry of FIG. 2 are a clock 42, two binary-coded-decimal latches 44, 46, a flip-flop 48, four two-input NAND gates 50, 52, 54, 56, three inverters 57, 58, 60 and a preprogrammed read-only-memory (labeled "ROM") 62.

Encoder 40 includes four output terminals 40a, 40b, 40c, 40d which are connected as shown to the four data input terminals 44a, 44b, 44c, 44d, respectively, in latch 44. Latch 44 also includes four output terminals 44e, 44f, 44g, 44h which are connected to conductors 64, 66, 68, 70, respectively. Also included in latch 44 are a strobe input 44i and a reset terminal (labeled "R") 44j. With data in the form of 0 and 1 states presented on the data inputs in latch 44, and on the occurrence of a strobe pulse (a 0 to 1 state change) on input 44i, the voltage states which appear on terminals 44a, 44b, 44c, 44d become locked in the memory of the latch, and are presented on outputs 44e, 44f, 44g, 44h, respectively.

Clock 42 is connected to the clock pulse input 40e in encoder 40. The clock operates herein at a frequency of about 10-KHz.

What is known as the strobe output terminal 40f in the encoder connects both with the input of inverter 57, and with the upper inputs of gates 50, 52 in FIG. 1. The output of inverter 57 connects with the clock pulse input 48a in flip-flop 48. The $\overline{Q}$, Q outputs (which are so marked) in the flip-flop are connected, respectively, to the lower inputs in gates 50, 52. The reset terminal in flip-flop 48 is shown at 48b.

The output of gate 50 connects with the left input of gate 54 in FIG. 2—the right input of the latter being directly connected to the output of gate 56. The output of gate 52 is connected both to the upper input of gate 56 in FIG. 2, and to the input of inverter 58. Further, it connects through a conductor 72 with the input of inverter 60. The lower input in gate 56 in FIG. 2 connects directly with the output of inverter 58, and through a capacitor 74 to ground. The output of inverter 60 is connected to the strobe input 46i in latch 46.

Latch 46 is substantially identical to latch 44. Thus, it includes four data inputs 46a, 46b, 46c, 46d, and four outputs 46e, 46f, 46g, 46h. Also, latch 46 includes a reset terminal 46j which corresponds to reset terminal (labeled "R") 44j in latch 44. Inputs 46a, 46b, 46c, 46d are connected to conductors 64, 66, 68, 70, respectively, through conductors 76, 78, 80, 82, respectively. Outputs 46e, 46f, 46g are connected to conductors 84, 86, 88, respectively. Output 46h is unconnected to anything external to latch 46. Latch 46 functions in exactly the same manner described above for latch 44.

It will be noted that in FIG. 2, latch 44 is labeled as "LSD LATCH", and latch 46 as "MSD LATCH". The letters "LSD" stand for the phrase "least significant digit", and the letters "MSD" stand for the phrase "most significant digit". As will become apparent, when a two-digit port address is "called-up" through operation of keyboard 22, the least significant digit in the address becomes stored, ultimately, in latch 44, and the most significant digit becomes stored in latch 46. Latches 44, 46 constitute memory means herein.

Memory 62 includes six inputs 62a, 62b, 62c, 62d, 62e, 62f, and five outputs 62g, 62h, 62i, 62j, 62k. Conductors 66, 68, 70 connect with inputs 62a, 62b, 62c, respectively. Conductors 84, 86, 88 connect with inputs 62d, 62e, 62f, respectively. Conductors 90, 92, 94, 96, 98 connect as illustrated with the five outputs in the memory.

Completing a description of what is shown in FIG. 2, connected to conductors 64, 66, 68, 70 are conductors 100, 102, 104, 106, respectively. Connected to conductors 84, 86, 88 are conductors 108, 110, 112, respectively. Conductors 100, 102, 104, 106 extend from the circuitry of FIG. 2 in a cable represented by bracket 114. Conductors 108, 110, 112 extend in a cable represented by bracket 116. Conductors 90, 92, 94, 96, 98, along with conductor 64, extend in a cable represented by bracket 118.

5. The Circuitry of FIG. 3

Referring now to FIG. 3, here are shown further details of the circuitry contained within control unit 12. Previously mentioned displays 24, 26 are represented centrally in block form, and are labeled "A" and "B". The input side of display 24 is connected in a known manner to the output of a conventional latch/decoder shown at 120—this connection being represented by the single line 122. The input side of display 26 is similarly connected to the output of another latch/decoder 124—such connection being represented by the single line 126. Decoders 120, 124 include conventional display-suppression inputs 120b, 124b, respectively. Conductors 125, 127 connect with inputs 120b, 124b, respectively. With a 1 state applied to such an input, the associated display shows nothing.

Decoders 120, 124 each have seven inputs which are connected to previously mentioned conductors 100, 102, 104, 106, 108, 110, 112 in cables 114, 116.

Latch decoder 120 includes a strobe input 120a which is connected to a conductor 128. Conductor 128 is connected to other circuitry (not shown in FIG. 3) which will be described shortly, and also to one output 130b of a pulse-shaping subcircuit represented by block 130. Details of the pulse-shaping subcircuit are not shown herein inasmuch as they are entirely conventional. Such details are easily embodied by anyone skilled in the art who is told (as occurs below) how the subcircuit performs. The other output 130c of subcircuit 130 is connected to a conductor 132. Conductor 132 connects with the reset terminals in latches 44, 46 and in flip-flop 48. Input 130a in subcircuit 130 connects with a conductor 134 which extends from keyboard 22.

A subcircuit arrangement substantially identical to that just described for latch/decoder 120 is provided for latch/decoder 124. Latch/decoder 124 includes a strobe input 124a connected to a conductor 136 which corresponds to conductor 128. A subcircuit 138 corresponding to subcircuit 130 has one of its outputs 138b connected to conductor 136, and its other output 138c connected to previously mentioned conductor 132. The input 138a in subcircuit 138 connects with a conductor 140 which extends from keyboard 22.

6. Operational description for FIGS. 2 and 3

Explaining now the operation of the circuitry illustrated in FIGS. 2 and 3, let us consider specifically the operation of calling-up the address of port 18b in switching circuit 18. To do this, keyboard 22 is actuated by first pressing the push button bearing the digit "2", whereupon encoder 40 immediately produces on its four outputs a pattern of 0 and 1 states which uniquely relate to this number.

As the key which has just been depressed is released, encoder 40 produces a positive-going, single, square-wave pulse which is referred to herein as a strobe pulse.

The normal, or reset, condition in flip-flop 48 produces a 1 state on the $\overline{Q}$ output, and a 0 state on the Q output therein. As a consequence, gate 50 is open to electrical activity on its upper input in FIG. 2, and gate 52 is closed, with its output held in a 1 state.

The leading edge of the strobe pulse just described is ineffective in the flip-flop. Such leading edge, however, causes the output of gate 50 to switch from 1 to 0, and inasmuch as there is at this time a 1 state on the right input of gate 54, this behavior causes the output of gate 54 to switch from a 0 state to a 1 state. As a consequence, latch 44 is strobed, whereupon the particular pattern of 0 and 1 state voltages that then appear on its four data inputs become locked in its memory, and presented on its four outputs (as explained earlier). More specifically, the particular voltage states which exist on inputs 44a, 44b, 44c, 44d then become presented on outputs 44e, 44f, 44g, 44h, respectively. It will also be noted that these four voltage states appear on conductors 64, 66, 68, 70, and consequently on conductors 76, 78, 80, 82. Thus, what now appears on the outputs of latch 44 is presented as data to the four inputs in latch 46.

The trailing edge of the strobe pulse, acting through inverter 57, toggles flip-flop 48, whereupon its $\overline{Q}$ output is switched to a 0 state, and its Q output to a 1 state. Gate 50 is now held closed with its output in a 1 state, and gate 52 is open to activity on its upper input in FIG. 2.

Inasmuch as we are now describing a situation wherein a single-digit address is being called up, no additional numeric push buttons are actuated in keyboard 22. There thus results a situation in which a code or pattern of voltage states uniquely relating to the number "2" appears on conductors 64, 66, 68, 70. The three outputs in latch 46 which are used herein are all at this time in 0 states. Accordingly, there is presented to the six inputs in memory 62 a six-bit pattern of voltages reflecting that a single-digit address has been called up.

As was previously mentioned, memory 62 is preprogrammed. More specifically, it is preprogrammed with an internal table which instantly relates different selected patterns of 0 and 1 states on its six inputs to related unique binary output patterns of 0 and 1 states on its five outputs. There is thus presented on the conductors in cable 118 a unique code of 0 and 1 states which indicates that address number "2" has been called up. As will be explained shortly, this information is furnished to circuitry still to be described with respect to FIGS. 4 and 5. Also, appearing on the conductors in cables 114, 116 is binary-coded-decimal data also relating uniquely to this numeric address. With reference to FIG. 3, it will be seen, therefore, that what now appears on the conductors in cables 114, 116 is presented to the inputs in latch/decoders 120, 124.

To complete the operation of calling up the address of a port, and still speaking with respect to addressing port 18b, it is necessary to identify which side or section of the system contains the port. Since port 18b is in section A, the push button designated "A" in keyboard 22 is now depressed. When this occurs, keyboard 22 furnishes over conductor 134 a 0 to 1 state change which causes a like voltage-state change on output 130b in subcircuit 130. This activity strobes latch/decoder 120, whereupon the latch/decoder stores, and furnishes at its output side, the data then presented on the conductors in cables 114, 116. As a consequence there is then presented to display 24, via the conductors represented by line 122 in FIG. 3, a pattern of voltage states which causes display 24, in its least significant digit side, to display the number "2". It will be recalled that display 24 is shown in this condition in FIG. 1.

Operation of the push button designated "A" has no effect on the operation of latch/decoder 124. Accordingly, and assuming that no port in switching circuit has yet been designated, the B display, 26, continues to display nothing in both digit positions therein. As will be explained later, the 0 to 1 state voltage change applied by output 130b to conductor 128 has an effect on the circuitry illustrated in FIG. 4.

When push button "A" is released, a voltage-state change from 1 to 0 occurs on conductor 134, which change produces a voltage-state change from 0 to 1 on conductor 132. This activity resets latches 44, 46 and flip-flop 48. As a consequence, the circuitry in FIG. 2 is then returned to the condition in which it initially resided prior to calling-up of the address of the port just described.

Calling-up of the address for port 20c on the B side of system 10 takes place in substantially an identical manner, except that the call-up operation is concluded by depressing the push button marked "B" in the keyboard. This produces a 0 to 1 state voltage change on conductor 140 which produces activity in subcircuit 138 which is substantially duplicative of that just described above for subcircuit 130. At this time, therefore, latch/decoder 124 is strobed, and a 0 to 1 state voltage change is applied via conductor 136 to the circuitry still to be described in FIG. 4. Release of the "B" push button effects a 0 to 1 state reset change on conductor 132 which again resets latches 44, 46 and flip-flop 48.

Further describing how the circuitry of FIG. 2 performs, let us consider the situation where the address of a selected port contains two digits, the first of which is "2", and the second of which, say, is "4"—namely, "24". Keyboard 22 is initially operated by depressing the push button designated "2", and this effects an operation like that described above with respect to beginning the call-up for port 18b. Now, however, before one of the lettered push buttons A, B is actuated, the push button designated "4" is depressed. When this occurs, encoder 40 places on its four outputs a pattern of 0 and 1 states which uniquely indicates depression of the push button designated "4". With release of this push button, encoder 40 produces another strobe pulse which is applied to the upper inputs of gates 50, 52.

Recalling that, at this time, the Q output in flip-flop 48 is in a 0 state, and the Q output is in a 1 state, gate 50 is closed, and gate 52 open. With receipt of the leading edge of the strobe pulse, the output of gate 52 changes from 1 to 0. Consequently, and through the operation of inverter 60, a 0 to 1 voltage state change is applied to strobe input 46i in latch 46. Latch 44 is still in a state locking into its memory the data earlier presented with respect to depression of the push button designated "2". Thus, although there is now different data presented to the input in this latch, the output terminals in the latch still present a set of voltage states relating to the first-introduced digit in the address.

Accordingly, when latch 46 is strobed, it locks into its memory data reflecting initial depression of the push button designated "2". Latch 46 then produces on its outputs a series of voltage states uniquely relating to the digit "2". In the particular system which is being described herein, only three of the output terminals in latch 46 are used. As will become apparent, were it desired to equip the system to handle a larger number of ports than those present in system 10, output 46h could additionally be used.

Continuing the description, the 1 to 0 change on the output of gate 52 is inverted by inverter 58 which applies a 0 to 1 state change on the lower input of gate 56 in FIG. 2 and also on capacitor 74. Capacitor 74 begins charging. The output of gate 56 remains in a 1 state inasmuch as, still, one of its inputs, namely its upper input in FIG. 2, is now in a 0 state. With receipt of the trailing edge of the strobe pulse, the output of gate 52 returns to a 1 state, and as a subsequent consequence of charging of capacitor 74, 1 states shortly thereafter exist for a short time on both inputs in gate 56. Consequently, the output of gate 56 switches from 1 to 0, and this causes the output of gate 54 to switch from 0 to 1—strobing latch 44 locks into its memory data reflecting the second-selected digit "4". Further, latch 44 presents on it four output terminals a pattern of 0 and 1 state voltages uniquely reflecting this digit.

Thus, presented now on the conductors in cable 116 is a pattern of voltage states reflecting the digit "2", and presented on the conductors in cable 114 is a pattern of voltage states reflecting the digit "4". Under this circumstance, memory 62 produces on the conductors in cable 118 an array of voltage states uniquely representing the number "24".

The appropriate A or B push button is now depressed to complete the addressing operation, and the associated display then displays the number "24".

7. The Circuitry of FIG. 4

Figure 4:
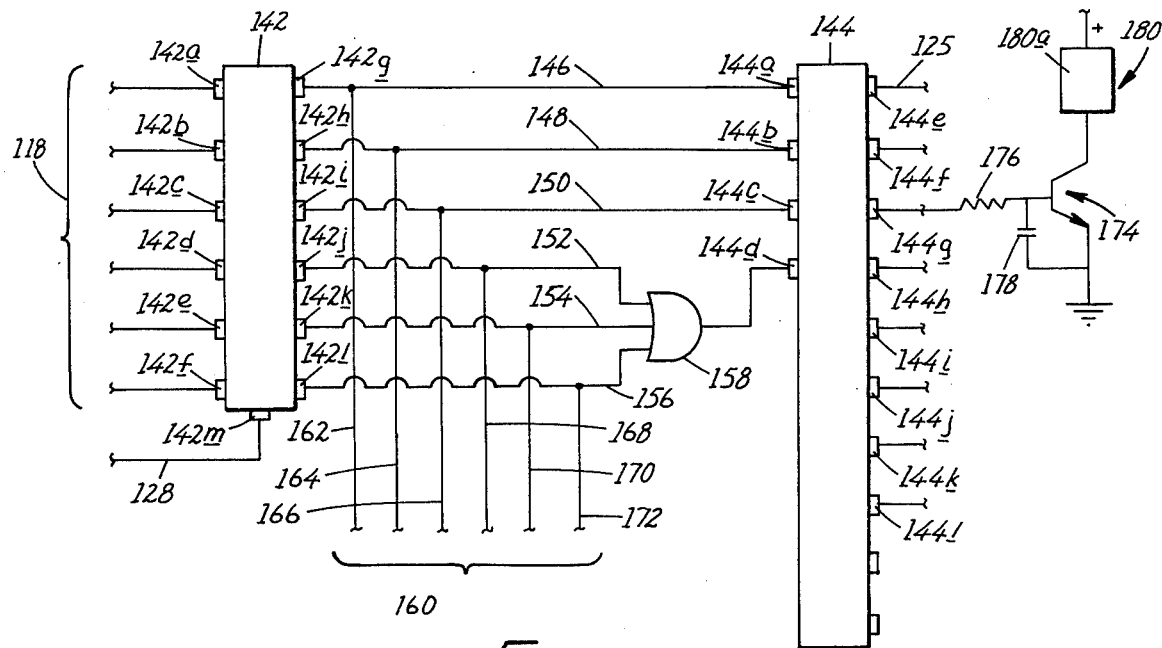
FIG. 4 is a block/schematic diagram illustrating the construction of what is referred to as a master switching controller in the system of FIG. 1.

Turning now to FIG. 4, shown in this figure is a master switching controller, and more particularly, such a controller for the A side of system 10. A similar controller is provided for the system's B side.

Included in this controller are a latch 142 and a 1-of-10 binary-coded-decimal to decimal decoder 144. Latch 142 has six inputs 142a, 142b, 142c, 142d, 142e, 142f and six outputs 142g, 142h, 142i, 142j, 142k, 142l. The inputs are connected to the conductors which make up cable 118. The outputs are connected to conductors 146, 148, 150, 152, 154, 156. Latch 142 also includes a strobe input 142m which is connected to previously mentioned conductor 128 that extends from latch/decoder 120 in FIG. 3.

Conductors 146, 148, 150 connect with inputs 144a, 144b, 144c, respectively, in decoder 144. The fourth input 144d in the decoder is connected to the output of an OR gate 158. Gate 158 has three inputs connected as shown to conductors 152, 154, 156. Shown by a bracket 160 is a cable having conductors 162, 164, 166, 168, 170, 172 which connect with conductors 146, 148, 150, 152, 154, 156, respectively. As will soon be explained, the conductors in cable 160 extend to a slave switching controller in system 10, such as the controller illustrated in FIG. 5.

In system 10, only eight of the ten output terminals in decoder 144 are used—these being shown at 144e, 144f, 144g, 144h, 144i, 144j, 144k, 144l. Output 144e connects with previously mentioned conductor 125 (see FIG. 3). Each of the other used outputs is connected to a circuit for operating a switching device, such as a relay, and one of these circuits is shown in FIG. 4 connected to output 144g. More specifically, the circuit now being referred to includes a transistor 174, whose base connects with output 144f through a resistor 176, and whose emitter is directly grounded. A capacitor 178 interconnects the transistor's base and emitter. The collector in the transistor connects through the coil 180a in a relay 180 to a suitable source of positive voltage.

An input 144d in decoder 144 acts as an enable input for the decoder. More specifically, in order to output information on an output terminal in the decoder, it is necessary that a 0 state be present on input 144d. In this manner, decoder 144 is "instructed", so-to-speak, with respect to when one of the relays operatively connected to its outputs is intended to be operated.

With the decoder enabled, a pattern of voltage states on its upper three inputs reflecting the number "0" produces a 1 state on output 144e, all other outputs then being in 0 states. An input voltage-state pattern reflecting the number "1" produces a 1 state exclusively on output 144f. Such a pattern representing the number "2" creates a 1 state exclusively on output 144g. And so on.

When a 1 state exists on one of the outputs, for example output 144g, which is connected to a relay-actuating circuit like that shown, the associated relay energizes and closes switches associated with it.

As is evident, decoder 144 is connected herein to handle seven different relays. Further, these relays are associated with the first seven numeric ports in the A side of system 10. As is well known to those skilled in the art, through the use of conventional binary coding, it is only necessary to utilize different patterns of 0 and 1 states on three different conductors to identify seven different circuits or conditions. Thus, all seven of the relays which are connected to the mentioned outputs in decoder 144 can be addressed simply through different patterns of 0 and 1 states on conductors 146, 148, 150.

It will be noted that, with latch 142 having six inputs and six outputs, it is capable of storing patterns of 0 and 1 states able to represent numbers significantly larger than seven. Within such numbers, the voltage states representing the least significant digit is presented on output 142g, with voltage states representing progressively more significant digits presented on progressively lower outputs in FIG. 4. Thus, when a user addresses one of the first seven ports on the A side of system 10, different coded patterns of voltage states capable of addressing these seven ports appear only on outputs 142g, 147h, 142i. The other three outputs in latch 142 remain in 0 states. Consequently, so long as only one of the first seven ports on the A side of system 10 is being addressed, a 1 state will always be applied to input 144d in decoder 144. And, the decoder will therefore be capable of outputting information on different ones of its output terminals.

Referring for a moment to the operation of decoder 144, should a user accidentally address a port number "0", which port number does not exist, a 1 state is produced on output 144e which is applied via conductor 125 to the display-suppression input 120b in decoder 120. It might also be noted that in the absence of any port being addressed on the A side of the system, a 1 state normally exists on conductor 125—producing this same condition in display 24.

Each of the relays which is associated with the eight designated outputs in decoder 144 is provided with a suitable number of switches that it closes when energized. In the particular system shown herein for handling stereo equipment, each such relay is effective to close four switches—two of which connect with conductors assigned to left-channel operation, and the other two of which connect with conductors assigned to right-channel operation. These switches are, naturally, placed in series with the port with which they are associated.

Considering briefly those times when there is to be addressed an A-side port other than one which is associated with one of the seven port-associated outputs in decoder 144, the binary code which will appear on the outputs of latch 142 will include at least one 1 state on one of outputs 142j, 142k, 142l. In other words, if a port having a number "9" or greater is being addressed, such a situation will exist. As a consequence, the output of OR gate 158 will be in a 1 state, whereupon decoder 144 will be disabled. With disabling of the decoder, 0 state voltages exist on all of its output terminals. And, as will now be explained, information from the outputs of latch 142 is fed via the conductors in cable 160 to one or more slave switching controllers, such as that illustrated in FIG. 5, which are provided for controlling or addressing additional ports (numbered above port number "7" on the A side of system 10).

8. The Circuitry of FIG. 5

Figure 5:
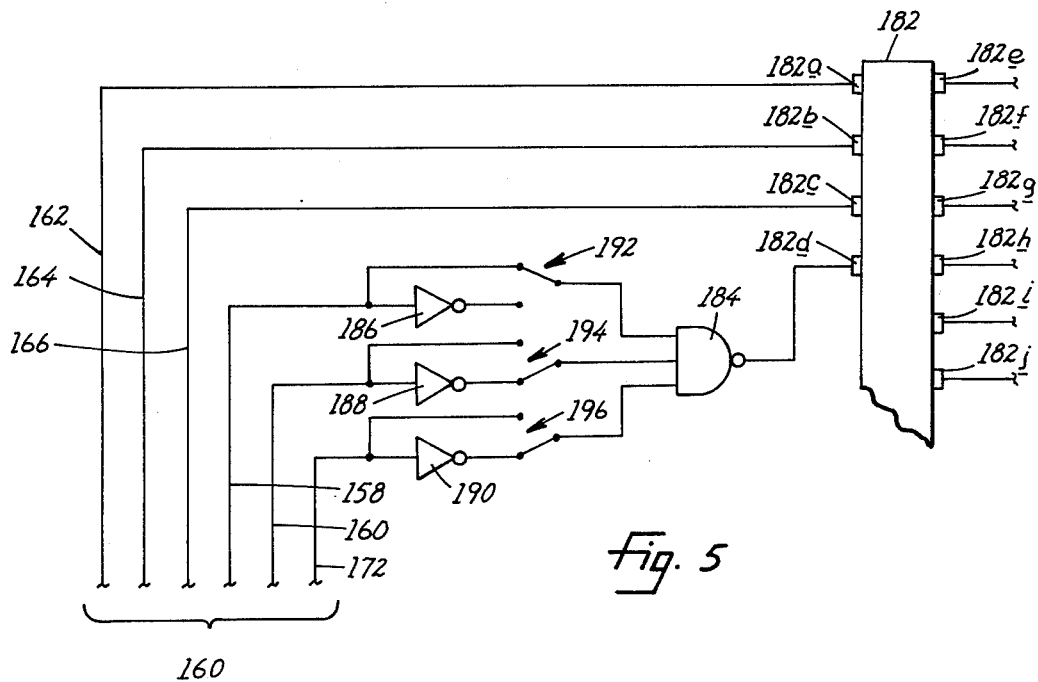
FIG. 5 is a block/schematic diagram illustrating what is referred to herein as a slave switching controller which couples to the controller of FIG. 4.

As has already been mentioned, FIG. 5 illustrates, fragmentarily, what is referred to herein as a slave switching controller that forms part of the A side of system 10. Included therein are a decoder 182, which is substantially identical to previously described decoder 144, a three-input NAND gate 184, and three inverters 186, 188, 190.

Decoder 182 includes four inputs 182a, 182b, 182c, 182d and ten outputs, the top six of which are shown at 182e, 182f, 182g, 182h, 182i, 182j in FIG. 5. These top six outputs, along with the next two outputs (not shown), making a total of eight used outputs, are connected to relay energizing or actuating circuits like that shown in FIG. 4. And, each of these eight used outputs is associated with a particular port on the A side of system 10.

Inputs 182a, 182b, 182c are connected to conductors 162, 164, 166, respectively, in cable 160. Thus, the specific pattern of 0 and 1 states on these three inputs may be used to address a particular one of the eight ports associated with the eight used outputs in decoder 182. The voltage states on conductors 168, 170, 172 in cable 160 are used to "inform" decoder 182 whether or not any one of its outputs is to be used for addressing a port. The particular code pattern which is effective to enable operation of decoder 182, by placing a 0 state on its input 182d, is determined through the operation of inverters 186, 188, 190, NAND gate 184, and three single-pole double-throw switches 192, 194, 196. The interconnections between the inputs of the NAND gate, the three switches just mentioned, and the three inverters are obvious in FIG. 5.

Accordingly, it will be seen, and considering the positions of the three switches, that whatever voltage state appears on conductor 168 is directly applied to the upper input of gate 184, and that whatever voltage states exist on conductors 170, 172 are applied in inverted form to the middle and lower inputs, respectively, in gate 184. Thus, should there appear a set of voltage states on conductors 168, 170, 172 (derived from conductors 152, 154, 156, respectively), which produces a 0 state on input 182d, then, and in accordance with the pattern of voltage states presented on inputs 182a, 182b, 182c, one of the ports associated with one of the outputs in decoder 182 is addressed.

It will thus be evident that the pattern of voltage states produced on the lower three outputs in latch 142 in FIG. 4 is used to enable a particular slave switching controller to function. And, with a pattern of three such voltage states available, seven different slave switching controllers can be enabled independently. Each of these, in turn, is capable of addressing eight different ports. Thus, sixty-three different ports, on the A side of system 10, can be addressed herein. This number is, of course, no limit on the system of this invention.

Conclusion

As was pointed out above, the B side of system 10 is constructed in substantially exactly the same manner as the A side thereof. An addressing operation on the B side takes place, also, in the same manner described for addressing on the system's A side.

When it is desired to set up an interconnection between an amplifier connected to a port on the A side of the system and a tuner connected to a port on the B side of the system, this is simply and quickly accomplished by addressing, in either order, the appropriate A-side and B-side ports. With completion of addressing of both ports, the system instantly sets up a conductive connection between the selected tuner and amplifier. Either or both selections can be changed independently simply by changing the called-for port address(es).

Also as was mentioned earlier, the system of the invention is not limited to two-channel operation. Those skilled in the art will readily see how the system can be expanded to accommodate three or more channels of ports.

It is recognized that while relay switching has been described herein, there may be many instances in which the current-carrying capacities of electromechanical relays is not necessary. More specifically, there may be many instances in which electronic switching devices may satisfactorily be used.

A further modification of the system which might be useful and desirable in a number of applications would be the incorporation of a microprocessor to handle the directing of information in the operation of the system. This also could readily be incorporated by one skilled in the art.

Thus there is provided a unique selection switching apparatus which offers all of the advantages, and has all of the features, ascribed to it earlier herein. And, while a preferred embodiment of the invention has been described, it is appreciated that variations and modifications may be made without departing from the spirit of the invention.

It is claimed and desired to secure by Letters Patent:

1. Electrical apparatus for selectively interconnecting different pieces of audio electrical equipment, said apparatus comprising means defining a plurality of binary-code-designated, address-assigned electrical coupling ports, each being adapted for external connection to a different piece of such equipment, means for addressing different selected pairs of said ports utilizing related binary-coded addresses, electronic memory means operatively connected to said addressing means for memorizing and storing the addresses of each such addressed pairs of ports, and selectively changeable circuit-path establishing means operatively connected both to said memory means and to said ports, operable, with said memory means storing the addresses of ports in an addressed pair of ports, to establish a circuit path coupling the same.

2. Electrical apparatus for selectively interconnecting different pieces of audio electrical equipment, said apparatus comprising means defining first and second sets of binarycode-designated address-assigned electrical coupling ports, each port in each set being adapted for external connection to a different piece of audio electrical equipment, addressing means operable to address different selected pairs of said ports utilizing related pairs of binary-coded addresses, with one port in each such addressed pair belonging to said first set, and the other port belonging to said second set, electronic memory means operatively connected to said addressing means for memorizing and storing the addresses of each such addressed pair of ports, and selectively changeable circuit-path establishing means operatively connected both to said memory means and to said ports, operable, with said memory means storing the addresses of ports in an addressed pair of ports, to establish a circuit path coupling the same.

* * * * *